United States Patent [19]
Bergen

[11] Patent Number: 4,816,780
[45] Date of Patent: Mar. 28, 1989

[54] MODULATOR COMPRISING A COMB FILTER

[75] Inventor: Franciscus H. M. Bergen, Eindhoven, Netherlands

[73] Assignee: U.S. Philips Corporation, New York, N.Y.

[21] Appl. No.: 151,368

[22] Filed: Feb. 2, 1988

[30] Foreign Application Priority Data

Feb. 2, 1987 [NL] Netherlands ............... 8700244

[51] Int. Cl.⁴ ............................................. H04N 9/39
[52] U.S. Cl. ............................... 332/1; 332/23 R; 358/24
[58] Field of Search ................ 332/1, 16 R, 32 R; 358/23, 24, 329, 330

[56] References Cited

U.S. PATENT DOCUMENTS 3,996,606 12/1986 Pritchard .......................... 358/329
3,996,610 12/1986 Kawamoto ..................... 358/329 X Primary Examiner—Eugene R. LaRoche
Assistant Examiner—Robert J. Pascal

[57] ABSTRACT

By the use of two additional mixing stages (21, 26) it is possible to replace the 2H glass delay line (operating at approximately 4.43 MHz) used in the known modulators by, for example, a charge-coupled device CCD (8) (which operates at approximately 625 kHz), enabling the total storage capacity required to be reduced in comparison with the situation in which the glass delay line is replaced directly by a CCD (operating at 4.43 MHz).

6 Claims, 1 Drawing Sheet

4,816,780

MODULATOR COMPRISING A COMB FILTER

BACKGROUND OF THE INVENTION

The invention relates to a modulator for converting a first electric signal modulated on a carrier wave of a first frequency into a second electric signal modulated on a carrier of a second frequency, the first frequency being lower than the second frequency, comprising
 a first input terminal for receiving the first electric signal,
 an output terminal for supplying the second electric signal, and
 a comb filter whose input is coupled to the first input terminal and whose output is coupled to the output terminal, the input of the comb filter being coupled to a first input of a signal-combination unit and by way of a delay means to a second input of the signal-combination unit whose output is coupled to the output of the comb filter, which modulator further comprises a second input terminal for receiving a third electric signal having a frequency which at least substantially corresponds to the first frequency and a third input terminal for receiving a fourth electric signal having a frequency which at least substantially corresponds to the second frequency, which second and third input terminals are coupled to the respective inputs of a first mixing stage which has an output coupled to a first input of a second mixing stage having a second input coupled to the first input terminal and having an output coupled to the first input of the signal combination unit.

Such a modulator is employed in the well-known PAL-V2000 video recorders to convert the chrominacnce signal which is read from a magnetic record carrier and is modulated on a carrier wave having a (first) frequency of approximately 625 kHz into a chrominance signal which is modulated on a (second) frequency of approximately 4.43 MHz, so that it is suitable for reproduction in a television set. The second mixing stage is arranged in the connection between the first input terminal of the modulator and the input of the comb filter. An oscillator supplying a carrier frequency of approximately 4.43 MHz is connected to the third terminal. A signal having a frequency of approximately 625 kHz is applied to the second input terminal. This signal is derived from the horizontal synchronizing signal by way of a phaselocked loop and therefore exhibits the same frequency variations as the carrier wave of the chrominance signal applied to the first input terminal. The result is that an up-converted chrominance signal with a fixed 4.43 MHz carrier is available on the output terminal.

It will be appreciated that for video recorders in accordance with the VHS or the video-8 system and for video signals in accordance with other standards, such as NTSC, other values (may) apply for the various frequencies. The comb filter in the modulator is used for reducing cross-talk arising in the chrominance signal read from the record carrier under the influence of the adjacnet tracks on the record carrier. The delay means provides a delay of 128 μs, which corresponds to twice the line period. The delay is provided by a glass delay line.

The glass delay line for delaying chrominance signals with a 4.43 MHz carrier by 128 μs is comparatively bulky, requires accurate adjustment and is expensive. It is the object of the invention to provide a modulator which can be more compact, which requires less adjustments and which can be cheaper if combined with other functions, such as for example skew correction.

SUMMARY OF THE INVENTION

To this end, the modulator in accordance with the invention is characterized in that the second input of the second mixing stage is coupled to the input of the comb filter, in that the second and the third output terminal are also coupled to respectively the first and the second input of a third mixing stage whose output is coupled to a first input of a fourth mixing stage having a second input coupled to the output of the delay means and having an output coupled to the second input of the signal-combination unit. The delay means can be constructed as a charge-coupled device or as a charge-transfer device, for example a bucket brigade, or as a digital delay line.

The invention is based on the idea of providing the delay at a location where chrominance signals on a carrier wave of lower frequency, for example the (first) frequency of 625 kHz, have to be delayed. By employing a charge-coupled device, referred to hereinafter as CCD for the purpose of delaying a substantial reduction in volume can be achieved. Moreover, a CCD requires less adjustments. On the other hand, a clock frequency must be available for operating the charge-coupled device. as the CCD need only handle chrominance signals of a comparatively low carrier frequency the clock frequency may also be comparatively low and a smaller storage capacity is required than in the case that the glass delay line operating in the 4.43 MHz range were replaced by a CCD operating in the 4.43 MHz range.

In order to ensure that the third signal applied to the first input of the third mixing stage has the correct phase, another delay means is arranged between the second input terminal and the first input of the mixing stage, which second delay means has the same delay timed as the first-mentioned delay means. In fact, this means a smaller gain in storage capacity in comparison with the situation that the glass delay line is replaced directly by a CCD operating in the frequency range around 4.43 MHz.

In order to ensure that the 4.43 MHz carrier applied to the third mixing stage has the correct phase, this allows requires a 128 μs delay (two line periods) in the connection between the third input terminal and the second input of the third mixing stage. As the phase difference of the carrier wave between two lines is exactly 90° this allows the use of a polarity inverter in this connection.

If it is also required to correct skew errors the clock frequency for the two delay means may be multiplied by 4/3 or by 4 and the comb filter may be disabled.

BRIEF DESCRIPTION OF THE DRAWINGS

An embodiment of the invention will now be described in more detail, by way of example, with reference to the accompanying drawings.

DESCRIPTION OF THE PREFERRED EMBODIMENT

Figure 1:
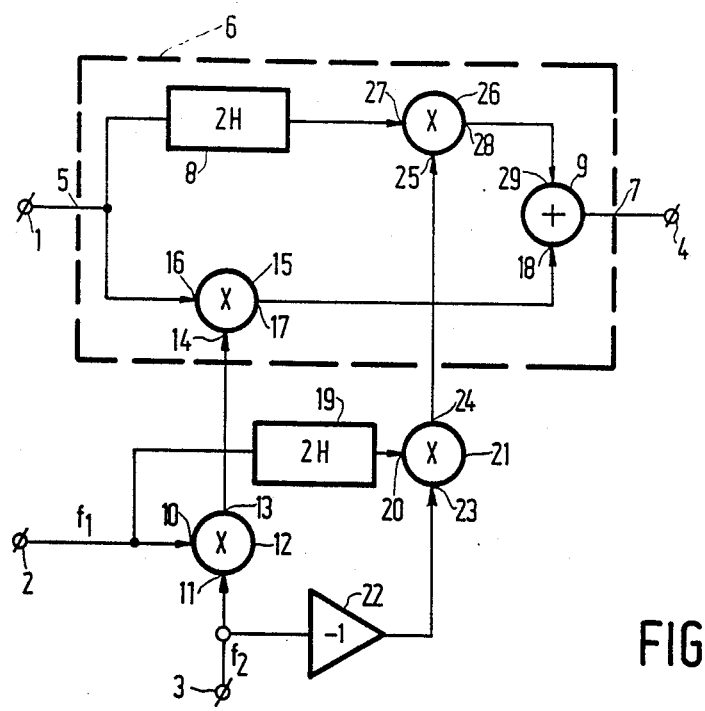
FIG. 1 shows an embodiment of the modulator in accordance with the invention.

The modulator in FIG. 1 has a first, a second and a third input terminal 1, 2 and 3, respectively, and an output terminal 4. The input terminal 1 is coupled to the input 5 of a comb filter 6 whose output terminal 7 is coupled to the output terminal 4. The comb filter comprises a delay means 8 and a signal-combination unit or adder 9. The input terminals 2 and 3 are coupled to respectively a first input 10 and a second input 11 of a first mixing stage 12. The output 13 of the mixing stage 12 is coupled to a first input 14 of a second mixing stage 15. The input 5 of the comb filter is coupled to a second input 16 of the mixing stage 15 whose output 17 is coupled to a first input 18 of the signal-combination unit 9. A further delay means 19 couples the input terminal 2 to a first input 20 of a third mixing stage 21. By means of a polarity inverter 22 the input terminal 3 is coupled to a second input 23 of the mixing stage 21. The output 24 of the mixing stage 21 is coupled to a first input 25 of a fourth mixing stage 26. The input 5 of the comb filter 6 is coupled to a second input 27 of the mixing stage 26 by way of the delay means 8, the output of mixing stage 26 being coupled to a second input 29 of the signal-combination unit 9.

The delay means 8 and 19 each provide a delay by two line periods of the chrominance signal applied to the input terminal 1, that is, they provide a delay of 128 $\mu s$ each. The delay means may be constructed as charge-coupled devices (CCDs), as charge-transfer devices or as digital delay lines.

The chrominance signal applied to the input terminal 1 is modulated on a 625 kHz carrier and is situated in a frequency range of ±500 kHz around the 625 kHz carrier. By means of low-pass filtering the chrominance signal C' is recovered from the video signal which is read from the magnetic record carrier by a video recorder (see FIG. 2a) and which also comprises the luminance signal Y'.

A carrier wave having a frequency f1, which is also approximately 625 kHz, is applied to the input terminal 2. This carrier wave is also derived from the video signal read from the magnetic record carrier, for example from the burst signal in the chrominance signal. This means that this carrier wave exhibits the same frequency variations (time errors) as the carrier wave of the chrominance signal, which frequency variations are caused by, for example, irregularities in the record carrier transport.

An oscillator supplying a carrier wave having a fixed frequency f2 of 4.43 MHz is coupled to the third input terminal 3.

Mixing the two carrier waves of the frequencies f1 (625 kHz) and f2 (4.43 MHz) results in two new carrier waves of frequencies fh=f1+f2 and fL=f1−2 on the output 13 of the mixing stage 12. Mixing these two carrier waves with the chrominance signal in the mixing stage 15 results in an up-converted chrominance signal at fh−f1 and fL+f1, which is modulated on a carrier wave having a frequency f2 of 4.43 MHz and two side bands on a carrier having frequencies f2−2f1 and f2+2f1, which are filtered out. Mixing in the mixing stages 21 and 26 proceeds in a similar way. This results in a chrominance signal C modulated on a 4.43 MHz carrier on the output carrier terminal 4, which signal may be combined with the luminance signal Y which has been converted to a frequency range extending up to approximately 3 MHz, after which the combined signal (see FIG. 2b) may be applied to a television set.

Figure 2A:
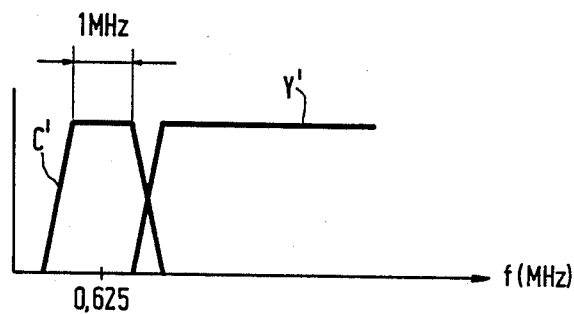
FIG. 2a shows diagrammatically a frequency-response characteristic of the PAL-video signal as recorded on a magnetic record carrier by means of a V2000 video recorder.
Figure 2B:
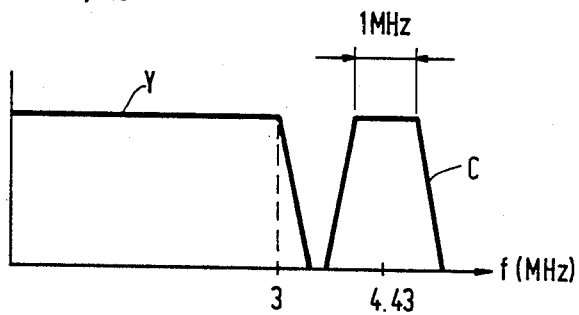
FIG. 2b shows diagrammatically a frequency-response characteristic of the PAL television signal.

From FIG. 1 and FIG. 2a it is evident that the delay means operate in the frequency range below 1.125 MHz. This means that the clock frequency for the CCD and the storage capacity can be reduced in comparison with the situation in which in known video recorders the glass delay line operating at a frequency of 4.43 MHz is replaced directly by a CCD.

This may be illustrated by means of the following numerical example: the lowest clock frequency that can be used for driving a CCD delay line is equal to twice the maximum frequency in the signal to be delayed by the CCD delay line. For the delay line operating at 4.43 MHz this frequency is therefore equal to $2 \cdot (4.43+0.5)=9.86$ MHz (see FIG. 2b). For the delay line operating in the frequency range below 1.125 MHz this frequency is equal to $2 \cdot (1.125)$ MHz$=2.25$ MHz (see FIG. 2a). The clock frequency of the delay line has been reduced by a factor of 4.4 ($=9.86/2.25$). Since in the embodiment shown in FIG. 1 requires two delay lines in comparison with one 4.43 MHz delay line, the storage capacity is reduced by a factor of 2.2. The four mixing stages 12, 15, 21 and 26 and the signal-combination unit 9 may be incorporated, for example, in one integrated circuit.

If the modulator described with reference to the FIGS. should also provide skew correction the clock frequency required for the delay lines may be multiplied by 4/3 or 4 and the comb filter may be disabled. This can be achieved by arranging a switch (not shown) between the output 17 of the modulator 15 and the input 18 of the signal-combination unit 9. During normal operation this switch is closed, so that the output 17 and the input 18 are coupled to one another, and the switch is open during correction of skew errors. However, it is then necessary to provide a correction for the change in amplitude on the output 7 caused by opening this switch.

It is evident that by changing over the clock frequency for the delay lines from a specific value $f_o$ to a value $4/3\, f_o$ or $4f_o$ during the transition from one track to another in a feature mode the delay changes from 2H to 3/2H and ½H respectively. This means that in both cases an exact compensation is provided for the difference of half a line period occurring at the transition between two consecutive tracks.

It is obvious that the luminance signal should also be corrected for said skew errors.

What is claimed is:

1. A modulator for converting a first electric signal modulated on a carrier wave of a first frequency into a second electric signal modulated on a carrier of a second frequency, the first frequency being lower than the second frequency, comprising a first input terminal for receiving the first electric signal, an output terminal for supplying the second electric signal, and a comb filter whose input is coupled to the first input terminal and whose output is coupled to the output terminal, the input of the comb filter being coupled to a first input of a signal-combination unit and via a delay means to a second input of the signal-combination unit whose output is coupled to the output of the comb filter, which modulator further comprises a second input terminal for receiving a third electric signal having a frequency which at least substantially corresponds to the first frequency and a third input terminal for receiving a fourth electric signal having a frequency which at least substantially corresponds to the second frequency, which second and third input terminals are coupled to the respective inputs of a first mixing stage which has an output coupled to a first input of a second mixing stage having a second input coupled to the first input terminal and having an output coupled to the first input of the signal combination unit, characterized in that the second input of the second mixing stage is coupled to the input of the comb filter, in that the second and the third input terminal are also coupled to the respectively first and the second input of a third mixing stage whose output is coupled to a first input of a fourth mixing stage having a second input coupled to the output of the delay means and having an output coupled to the second input of the signal-combination unit.

2. A modulator as claimed in claim 1, characterized in that the delay means is constructed as a charge-coupled device (CCD).

3. A modulator as claimed in claim 1, characterized in that the delay means is constructed as a charge-transfer device, for example a bucket brigade.

4. A modulator as claimed in any one of claims 1, 2, or 3, characterized in that another delay means having the same delay time as the first-mentioned delay means is arranged between the second input terminal and the first input of the third mixing stage.

5. A modulator as claimed in any one of claims 1, 2, or 3, characterized in that a polarity inverter is arranged between the third input terminal and the second input of the third mixing stage.

6. A modulator as claimed in claim 4, characterized in that a polarity inverter is arranged between the third input terminal and the second input of the third mixing stage.

* * * * *